US006784049B2

(12) United States Patent
Vaartstra

(10) Patent No.: US 6,784,049 B2
(45) Date of Patent: Aug. 31, 2004

(54) METHOD FOR FORMING REFRACTORY METAL OXIDE LAYERS WITH TETRAMETHYLDISILOXANE

(75) Inventor: Brian A. Vaartstra, Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/229,653

(22) Filed: Aug. 28, 2002

(65) Prior Publication Data

US 2004/0043633 A1 Mar. 4, 2004

(51) Int. Cl.$^7$ ........................................... H01L 21/8242
(52) U.S. Cl. ........................ 438/240; 438/253; 438/396
(58) Field of Search ........................... 438/3, 240, 253, 438/396; 257/310

(56) References Cited

U.S. PATENT DOCUMENTS

| 5,256,244 A |   | 10/1993 | Ackerman |
|---|---|---|---|
| 5,401,305 A | * | 3/1995 | Russo et al. ............. 106/287.1 |
| 5,468,687 A |   | 11/1995 | Carl et al. |
| 5,487,918 A |   | 1/1996 | Akhtar |
| 5,863,337 A | * | 1/1999 | Neuman et al. ............ 118/718 |
| 6,118,146 A |   | 9/2000 | Park et al. |
| 6,133,086 A |   | 10/2000 | Huang et al. |
| 6,146,959 A |   | 11/2000 | DeBoer et al. |
| 6,200,847 B1 |   | 3/2001 | Kishiro |
| 6,265,260 B1 |   | 7/2001 | Alers et al. |
| 6,328,947 B1 | * | 12/2001 | Monden et al. ............. 423/611 |
| 6,487,918 B1 | * | 12/2002 | DeAngelis ............... 73/861.66 |
| 2002/0094634 A1 | * | 7/2002 | Chung et al. ............... 438/240 |
| 2002/0102810 A1 | * | 8/2002 | Iizuka et al. ................ 438/396 |
| 2002/0157611 A1 | * | 10/2002 | Bondestam et al. ........ 118/725 |
| 2003/0143328 A1 | * | 7/2003 | Chen et al. ............ 427/255.28 |

FOREIGN PATENT DOCUMENTS

WO    WO 9526355    10/1995

OTHER PUBLICATIONS

Grant & Hackh's Chemical Dictionary, McGraw–Hill Book Company, 5$^{th}$ edition, 1987:221.

(List continued on next page.)

Primary Examiner—John F. Niebling
Assistant Examiner—Jennifer M. Kennedy
(74) Attorney, Agent, or Firm—Mueting, Raasch & Gebhardt, P.A.

(57) ABSTRACT

A method of forming (and apparatus for forming) refractory metal oxide layers, such as tantalum pentoxide layers, on substrates by using vapor deposition processes with refractory metal precursor compounds and ethers.

43 Claims, 3 Drawing Sheets

OTHER PUBLICATIONS

"Material Safety Data Sheet– Catalog # 235733, Name: 1,1,3,3–Tetramethyldisiloxane, 97%" *Aldrich Chemical Co., Inc.* [online]. [retrieved Jun. 23, 2003]. Retrieved from the internet: <http://infonew.sigma–aldrich.com/cgi–bin/gx.cgi/Applogic+MSDSInfo.ReturnMSDS>;3 pgs.

"Material Safety Data Sheet– Catalog # 326739, Name: Hexamethyldisiloxane, 99.5+%, NMR Grade," *Aldrich Chemical Co., Inc.* [online]. [retrieved Jun. 23, 2003]. Retrieved from the internet: <http://infonew–sigma–aldrich.com/cgi–bin/gx.cgi/Applogic+MSDSInfo.ReturnMSDS>;3 pgs.

Chaneliere et al., "Dielectric Permittivity of Amorphous and Hexagonal Electron Cyclotron Resonance Plasma Deposited $Ta_2O_5$ Thin Films," *Electrochemical and Solid–State Letters*, 1999, Jun.; 2(6):291–3.

Hawley, *The Condensed Chemical Dictionary*, $10^{th}$ Edition, Van Nostrand Reinhold Co., New York, 1981; 225–226.

Jiménez et al., "Deposition of $Ta_2O_5$ and $(Tio_2)-(Ta_2O_5)$ films from $Ta(OEt)_4(DMAE)$ and $Ti(OEt)_2(DMAE)_2$, by IMOCVD," *J. Phys. IV France*, 1999; 9:Pr8–569–PR8–573.

Kishiro et al., "Structure and Electrical Properties of Thin $Ta_2O_5$ Deposited on Metal Electrodes," *Jpn. J. Appl. Phys.*, 1998, Mar.; 37(3B):1336–9.

Lin et al, "$Ta_2O_5$ thin films with exceptionally high dielectric constant," *Applied Physics Letter*, 1999, Apr.; 74(16):2370–2.

"Refractory," *Webster's New Universal Unabridged Dictionary*, Avenel, New Jersey, 1992: p. 1207.

Vehkamäki et al., "Growth of $SrTiO_3$ and $BaTiO_3$ Thin Films by Atomic Layer Deposition," *Electrochemical and Solid–State Letters*, 1999; 2(10):504–6.

* cited by examiner

METHOD FOR FORMING REFRACTORY METAL OXIDE LAYERS WITH TETRAMETHYLDISILOXANE

FIELD OF THE INVENTION

This invention relates to method of forming a refractory metal (preferably, tantalum) oxide layer, and particularly to a method of forming a tantalum pentoxide layer, on a substrate using a reactive deposition process with a refractory metal precursor compound with an ether.

BACKGROUND OF THE INVENTION

In integrated circuit manufacturing, microelectronic devices such as capacitors are the basic energy storage devices in random access memory devices, such as dynamic random access memory (DRAM) devices, static random access memory (SRAM) devices, and ferroelectric memory (FERAM) devices. Capacitors typically consist of two conductors, such as parallel metal or polysilicon plates, which act as the electrodes (i.e., the storage node electrode and the cell plate capacitor electrode), insulated from each other by a layer of dielectric material.

The continuous shrinkage of microelectronic devices over the years has led to a situation where the materials traditionally used in integrated circuit technology are approaching their performance limits. Silicon (i.e., doped polysilicon) has generally been the substrate of choice, and silicon dioxide ($SiO_2$) has frequently been used as the dielectric material to construct microelectronic devices. However, when the $SiO_2$ layer is thinned to about 10 Å (i.e., a thickness of only 4 or 5 molecules), as is desired in the newest micro devices, the dielectric layer no longer effectively performs effectively as an insulator due to the tunneling current running through it. This $SiO_2$ thin layer deficiency has lead to a search for improved dielectric materials.

Refractory metal oxides such as tantalum pentoxide ($Ta_2O_5$), titanium dioxide ($TiO_2$), zirconium dioxide ($ZrO_2$), and hafnium dioxide ($HfO_2$), are some of the most promising $SiO_2$ replacements for future DRAM devices since they meet the requirements for large scale processing and fabrication using conventional microelectronics processing equipment. Furthermore, these oxides have excellent step coverage, and they exhibit comparatively low leakage current. $Ta_2O_5$ is of particular interest as layers of amorphous $Ta_2O_5$ have a dielectric constant of about 25. $Ta_2O_5$ layers can be formed using chemical vapor deposition (CVD) processes. For example, reacting vapors of $Ta(OC_2H_5)_5$ (pentaethoxy-tantalum) with oxygen or by reacting vapors of $TaF_5$ with an $O_2/H_2$ plasma can form $Ta_2O_5$.

Annealing can improve the crystallinity and resulting dielectric constant of refractory metal oxide layers. For example, the dielectric constant of an amorphous $Ta_2O_5$ layer can be increased to at least 40 by annealing the deposited layer at temperatures over 700° C., causing a change in crystallinity from an amorphous state to what is believed to be a preferred (001) orientation of a crystalline hexagonal phase of $Ta_2O_5$. Unfortunately, this increase in dielectric constant of annealed crystalline $Ta_2O_5$ layers is counterbalanced by higher leakage currents through the crystal boundaries. High temperature annealing of a $Ta_2O_5$ layer on polysilicon also inevitably produces a thin $SiO_2$ interfacial layer between the $Ta_2O_5$ layer and the polysilicon due to ambient oxidation during the deposition process and during any post-processing such as annealing. This $SiO_2$ layer insures better interfacial properties but also causes a reduction of the global dielectric constant of the $Ta_2O_5$ capacitor. A metal nitride barrier layer can be applied to the polysilicon substrate prior to formation of the $Ta_2O_5$ layer to avoid formation of the $SiO_2$ interfacial layer but at the cost of adding another processing step. Metal nitride barrier layers are also likely to be oxidized by high temperature anneal processes.

Changing the nature of the substrate and curing conditions during CVD processing can improve the dielectric constant of resulting $Ta_2O_5$ layers. For example, Kishiro et al., "Structure and Electrical Properties of Thin Deposited on Metal Electrodes," Jpn. J. Appl. Phys., 37:1336–1338 (1998) report crystalline $Ta_2O_5$ layers having dielectric constants over 50 made by depositing the layers on platinum and ruthenium substrates rather than on poly-Si electrodes and annealing at 750° C. For another example, Lin et al., "$Ta_2O_5$ thin films with exceptionally high dielectric constant," Applied Physics Newsletter, 74(16):2370–2372 (1999) report that if a $Ta_2O_5$ layer is deposited on a $Ru/TiN/Ti/SiO_2$ layered substrate, its dielectric constant can be increased up to 90–110 after $N_2O$ plasma treatment and then rapid thermal nitridation (RTN) at 800° C.

To date, efforts to improve the dielectric constant of $Ta_2O_5$ layers have either required high temperature processing that has led to various layer deficiencies or have required specialized processing or substrate considerations. Thus, there remains a need for a vapor deposition process to form $Ta_2O_5$ layers that have high dielectric constants and low current leakage, and that preferably do not require high temperature annealing, do not utilize oxidizers that can cause the formation of $SiO_2$ interfacial layers on polysilicon substrates, and do not require specialized processing or substrate considerations.

SUMMARY OF THE INVENTION

The present invention is directed toward using a vapor deposition process using refractory metal precursor compounds and ethers to form refractory metal oxide layers, especially tantalum pentoxide ($Ta_2O_5$) layers, on substrates. The vapor deposition process is preferably a reactive vapor deposition process that involves co-reacting the precursor compounds and the ethers.

The methods of the present invention involve forming a refractory metal oxide layer on a substrate by using a vapor deposition process and one or more refractory metal precursor compounds of the formula $MY_n$ (Formula I), wherein M is a refractory metal, each Y is independently a halogen atom, and n is an integer selected to match the valence of the metal M, and one or more ethers of the formula $R^1$—O—$R^2$, wherein $R^1$ and $R^2$ are each independently organic groups.

In one embodiment, a method of forming a layer on a substrate is provided that includes: providing a substrate (preferably a semiconductor substrate or substrate assembly such as a silicon wafer); providing a vapor that includes one or more refractory metal precursor compounds of the formula $MY_n$, wherein M is a refractory metal (e.g., tantalum), each Y is independently a halogen atom (preferably, F, Cl, I, or combinations thereof, and more preferably, F), and n is an integer selected to match the valence of the metal M (e.g., n=5 when M=Ta); providing a vapor that includes one or more ethers of the formula $R^1$—O—$R^2$, wherein $R^1$ and $R^2$ are each independently organic groups (e.g., alkyl groups, alkenyl groups, aryl groups, silyl groups, and combinations thereof); and directing the vapors of the one or more refractory metal precursor compounds and the one or more ethers to the substrate to form a refractory metal oxide layer on one or more surfaces of the substrate.

The present invention also provides a method of manufacturing a memory device. The method includes: providing a substrate (preferably a semiconductor substrate or substrate assembly such as a silicon wafer) having a first electrode thereon; providing a vapor that includes one or more refractory metal precursor compounds of the formula $MY_n$, wherein M is a refractory metal, each Y is independently a halogen atom, and n is an integer selected to match the valence of the metal M; providing a vapor that includes one or more ethers of the formula $R^1$—O—$R^2$, wherein $R^1$ and $R^2$ are each independently organic groups; directing the vapors that include the one or more refractory metal precursor compounds and the one or more ethers to the substrate to form a refractory metal oxide dielectric layer on the first electrode of the substrate; and forming a second electrode on the dielectric layer.

The present invention also provides a vapor deposition apparatus that includes: a vapor deposition chamber having a substrate (e.g., a silicon wafer) positioned therein; and one or more vessels that include one or more refractory metal precursor compounds of the formula $MY_n$, wherein M is a refractory metal, each Y is independently a halogen atom, and n is an integer selected to match the valence of the metal M; and one or more vessels that include one or more ethers of the formula $R^1$—O—$R^2$, wherein $R^1$ and $R^2$ are each independently organic groups. Optionally, the apparatus includes one or more sources of an inert carrier gas for transferring the precursors to the vapor deposition chamber, and/or one or more vessels that include one or more metal-containing precursor compounds having a formula different from $MY_n$.

The methods of the present invention can utilize a chemical vapor deposition (CVD) process, which can be pulsed, or an atomic layer deposition (ALD) process (a self-limiting vapor deposition process that includes a plurality of deposition cycles, typically with purging between the cycles). Preferably, the methods of the present invention use ALD. For certain ALD processes, the tantalum oxide layer is formed by alternately introducing one or more precursor compounds and ethers into a deposition chamber during each deposition cycle.

"Substrate" as used herein refers to any base material or construction upon which a metal-containing layer can be deposited. The term "substrate" is meant to include semiconductor substrates and also include non-semiconductor substrates such as films, molded articles, fibers, wires, glass, ceramics, machined metal parts, etc.

"Semiconductor substrate" or "substrate assembly" as used herein refers to a semiconductor substrate such as a metal electrode, base semiconductor layer or a semiconductor substrate having one or more layers, structures, or regions formed thereon. A base semiconductor layer is typically the lowest layer of silicon material on a wafer or a silicon layer deposited on another material, such as silicon on sapphire. When reference is made to a substrate assembly, various process steps may have been previously used to form or define regions, junctions, various structures or features, and openings such as capacitor plates or barriers for capacitors.

"Layer" as used herein refers to any metal-containing layer that can be formed on a substrate from the precursor compounds of this invention using a vapor deposition process. The term "layer" is meant to include layers specific to the semiconductor industry, such as "barrier layer," "dielectric layer," and "conductive layer." (The term "layer" is synonymous with the term "film" frequently used in the semiconductor industry.) The term "layer" is also meant to include layers found in technology outside of semiconductor technology, such as coatings on glass.

"Dielectric layer" as used herein is a term used in the semiconductor industry that refers to an insulating layer (sometimes referred to as a "film") having a high dielectric constant that is typically positioned between two conductive electrodes to form a capacitor. For this invention, the dielectric layer is a refractory metal oxide layer, preferably a $Ta_2O_5$ layer, formed using a reactive deposition process.

"Refractory metal" as defined by Webster's New Universal Unabridged Dictionary (1992) is a metal that is difficult to fuse, reduce, or work. For the purposes of this invention, the term "refractory metal" is meant to include the Group IVB metals (i.e., titanium (Ti), zirconium (Zr), hafnium (Hf)); the Group VB metals (i.e., vanadium (V), niobium (Nb), tantalum (Ta)); and the Group VIB metals (i.e., chromium (Cr), molybdenum (Mo) and tungsten (W)).

"Precursor compound" as used herein refers to refractory metal precursor compounds, tantalum precursor compounds, nitrogen precursor compounds, silicon precursor compounds, and other metal-containing precursor compounds, for example. A suitable precursor compound is one that is capable of forming, either alone or with other precursor compounds, a refractory metal-containing layer on a substrate using a vapor deposition process. The resulting metal-containing layers are typically oxide layers, which are useful as dielectric layers.

"Deposition process" and "vapor deposition process" as used herein refer to a process in which a metal-containing layer is formed on one or more surfaces of a substrate (e.g., a doped polysilicon wafer) from vaporized precursor compound(s). Specifically, one or more metal precursor compounds are vaporized and directed to one or more surfaces of a heated substrate (e.g., semiconductor substrate or substrate assembly) placed in a deposition chamber. These precursor compounds form (e.g., by reacting or decomposing) a non-volatile, thin, uniform, metal-containing layer on the surface(s) of the substrate. For the purposes of this invention, the term "vapor deposition process" is meant to include both chemical vapor deposition processes (including pulsed chemical vapor deposition processes) and atomic layer deposition processes.

"Chemical vapor deposition" (CVD) as used herein refers to a vapor deposition process wherein the desired layer is deposited on the substrate from vaporized metal precursor compounds and any reaction gases used within a deposition chamber with no effort made to separate the reaction components. In contrast to a "simple" CVD process that involves the substantial simultaneous use of the precursor compounds and any reaction gases, "pulsed" CVD alternately pulses these materials into the deposition chamber, but does not rigorously avoid intermixing of the precursor and reaction gas streams, as is typically done in atomic layer deposition or ALD (discussed in greater detail below).

"Atomic layer deposition" (ALD) as used herein refers to a vapor deposition process in which numerous consecutive deposition cycles are conducted in a deposition chamber. Typically, during each cycle the metal precursor is chemisorbed to the substrate surface; excess precursor is purged out; a subsequent precursor and/or reaction gas is introduced to react with the chemisorbed layer; and excess reaction gas (if used) and by-products are removed. As compared to the one cycle chemical vapor deposition (CVD) process, the longer duration multi-cycle ALD process allows for improved control of layer thickness by self-limiting layer growth and minimizing detrimental gas phase reactions by separation of the reaction components. The term "atomic layer deposition" as used herein is also meant to include the related terms "atomic layer epitaxy" (ALE) (see U.S. Pat. No. 5,256,244 (Ackerman)), molecular beam epitaxy (MBE), gas source MBE, organometallic MBE, and chemical beam epitaxy when performed with alternating pulses of precursor compound(s), reaction gas and purge (i.e., inert carrier) gas.

"Chemisorption" as used herein refers to the chemical adsorption of vaporized reactive precursor compounds on the surface of a substrate. The adsorbed species are irreversibly bound to the substrate surface as a result of relatively strong binding forces characterized by high adsorption energies (>30 kcal/mol), comparable in strength to ordinary chemical bonds. The chemisorbed species are limited to the formation of a monolayer on the substrate surface. (See "The Condensed Chemical Dictionary", 10th edition, revised by G. G. Hawley, published by Van Nostrand Reinhold Co., New York, 225 (1981)). The technique of ALD is based on the principle of the formation of a saturated monolayer of reactive precursor molecules by chemisorption. In ALD one or more appropriate reactive precursor compounds are alternately introduced (e.g., pulsed) into a deposition chamber and chemisorbed onto the surfaces of a substrate. Each sequential introduction of a reactive precursor compound is typically separated by an inert carrier gas purge. Each precursor compound co-reaction adds a new atomic layer to previously deposited layers to form a cumulative solid layer. The cycle is repeated, typically for several hundred times, to gradually form the desired layer thickness. It should be understood, however, that ALD can use one precursor compound and one reaction gas.

DETAILED DESCRIPTION OF PREFERRED EMBODIMENTS OF THE INVENTION

Figure 1:
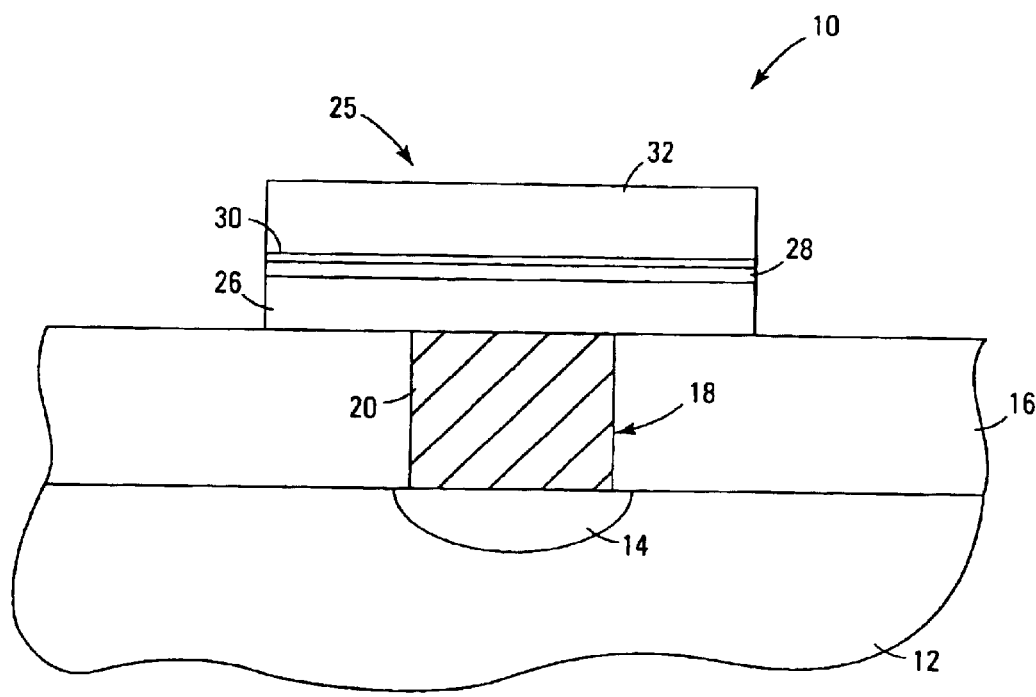
FIGS. 1–3 are exemplary capacitor constructions.

The present invention provides a method of forming metal oxide layers on substrates by using vapor deposition processes using one or more refractory metal precursor compounds and one or more ethers. The refractory metal precursor compounds are of the formula $MY_n$, wherein M is a refractory metal, each Y is independently a halogen atom, and n is an integer selected to match the valence of the metal M. The one or more ethers are of the formula $R^1$—O—$R^2$, wherein $R^1$ and $R^2$ are each independently organic groups. Preferably, M is tantalum and the formed refractory metal oxide layer is a tantalum pentoxide layer.

The layers or films formed can be in the form of refractory metal oxide-containing films, wherein the layer includes one or more refractory metal oxides optionally doped with other metals. Thus, the term "refractory metal oxide" films or layers encompass just refractory metal oxide as well as doped films or layers thereof (i.e., mixed metal oxides). Such mixed metal species can be formed using one or more metal-containing precursor compounds of a formula different from Formula I, which can be readily determined by one of skill in the art.

The refractory metal oxide layers typically have a thickness of about 10 Å to about 100 Å. A preferred layer is a $Ta_2O_5$ layer. Preferred tantalum pentoxide layers include a combination of amorphous material and at least some crystalline hexagonal phase, preferably with patterned (001) orientation. Such $Ta_2O_5$ layers do not require high temperature annealing (i.e., heating to temperatures of at least 700° C.) as is normally required to crystallize fully amorphous layers but surprisingly exhibit a desirable combination of high dielectric constants, typically in the range of 50 to 100, and low leakage currents, typically in the range of $10^{-7}$ to $10^{-9}$ A/cm$^2$, soon after completion of the vapor deposition processing.

The substrate on which the metal-containing layer is formed is preferably a semiconductor substrate or substrate assembly. Any suitable semiconductor material is contemplated, such as for example, conductively doped polysilicon (for this invention simply referred to as "silicon"). A substrate assembly may also contain a layer that includes platinum, iridium, rhodium, ruthenium, ruthenium oxide, titanium nitride, tantalum nitride, tantalum-silicon-nitride, silicon dioxide, aluminum, gallium arsenide, glass, etc., and other existing or to-be-developed materials used in semiconductor constructions, such as dynamic random access memory (DRAM) devices and static random access memory (SRAM) devices, for example.

Substrates other than semiconductor substrates or substrate assemblies can be used in methods of the present invention. These include, for example, fibers, wires, etc. If the substrate is a semiconductor substrate or substrate assembly, the layers can be formed directly on the lowest semiconductor surface of the substrate, or they can be formed on any of a variety of the layers (i.e., surfaces) as in a patterned wafer, for example.

Refractory metal precursor compounds useful in the practice of this invention include any reactive refractory metal compounds. Preferably, the refractory metal precursor compounds are of the formula $MY_n$ (Formula I), wherein M is a refractory metal, Y is independently a halogen atom, and n is an integer selected to match the valence of the metal M (e.g., n would be 5 for a pentavalent metal). More preferably, each Y is a fluorine atom. More preferably, M is Ti, Nb, Ta, Mo, or W. Most preferably, M is Ti or Ta.

Preferably, M is tantalum and n is 5, so that the refractory metal precursor compound is a tantalum precursor compound of the formula $TaY_5$ wherein Y is defined as above. More preferably, Y is fluorine and the tantalum precursor compound is $TaF_5$. Useful tantalum precursor compounds include $TaF_5$, $TaCl_5$, and $TaBr_5$ (all available from Sigma-Aldrich Chemical Company, Milwaukee, Wis.).

Ether compounds useful in this invention are of the formula $R^1$—O—$R^2$ wherein $R^1$ and $R^2$ is each independently an organic group. As used herein, the term "organic group" is used for the purpose of this invention to mean a hydrocarbon group that is classified as an aliphatic group, cyclic group, or combination of aliphatic and cyclic groups (e.g., alkaryl and aralkyl groups). In the context of the present invention, suitable organic groups for precursor compounds of this invention are those that do not interfere with the formation of a metal-containing layer using vapor deposition techniques. In the context of the present invention, the term "aliphatic group" means a saturated or unsaturated linear or branched hydrocarbon group. This term is used to encompass alkyl, alkenyl, and alkynyl groups, for example. The term "alkyl group" means a saturated linear or branched monovalent hydrocarbon group including, for example, methyl, ethyl, n-propyl, isopropyl, t-butyl, amyl, heptyl, 2-ethylhexyl, dodecyl, octadecyl, and the like. The term "alkenyl group" means an unsaturated, linear or branched monovalent hydrocarbon group with one or more olefinically unsaturated groups (i.e., carbon-carbon double bonds), such as a vinyl group. The term "alkynyl group" means an unsaturated, linear or branched monovalent hydrocarbon group with one or more carbon-carbon triple bonds. The term "cyclic group" means a closed ring hydrocarbon group that is classified as an alicyclic group, aromatic group, or heterocyclic group. The term "alicyclic group" means a cyclic hydrocarbon group having properties resembling those of aliphatic groups. The term "aromatic group" or "aryl group" means a mono- or polynuclear aromatic hydrocarbon group. The term "heterocyclic group" means a closed ring hydrocarbon in which one or more of the atoms in the ring is an element other than carbon (e.g., nitrogen, oxygen, sulfur, etc.).

As a means of simplifying the discussion and the recitation of certain terminology used throughout this application, the terms "group" and "moiety" are used to differentiate between chemical species that allow for substitution or that may be substituted and those that do not so allow for substitution or may not be so substituted. Thus, when the term "group" is used to describe a chemical substituent, the described chemical material includes the unsubstituted group and that group with nonperoxidic O, N, S, Si, or F, atoms, for example, in the chain as well as carbonyl groups or other conventional substituents. Where the term "moiety" is used to describe a chemical compound or substituent, only an unsubstituted chemical material is intended to be included. For example, the phrase "alkyl group" is intended to include not only pure open chain saturated hydrocarbon alkyl substituents, such as methyl, ethyl, propyl, t-butyl, and the like, but also alkyl substituents bearing further substituents known in the art, such as hydroxy, alkoxy, alkylsulfonyl, halogen atoms, cyano, nitro, amino, carboxyl, etc. Thus, "alkyl group" includes ether groups, haloalkyls, nitroalkyls, carboxyalkyls, hydroxyalkyls, sulfoalkyls, etc. On the other hand, the phrase "alkyl moiety" is limited to the inclusion of only pure open chain saturated hydrocarbon alkyl substituents, such as methyl, ethyl, propyl, t-butyl, and the like.

In the ether compounds, preferably at least one of $R^1$ and $R^2$ is selected from the group of alkyl groups, alkenyl groups, aryl groups, silyl groups, or combinations thereof (any of which may be branched or unbranched). At least one of $R^1$ and $R^2$ can optionally contain functional groups such as ether, amino, and carbonyl groups. More preferably, at least one of $R^1$ and $R^2$ is an alkyl, alkenyl, aryl, or silyl group (preferably an alkyl group) that forms a stable radical or carbocation, such as a benzyl, allyl, t-butyl, dimethylsilyl or trimethylsilyl group. Most preferably, at least one of $R^1$ and $R^2$ is a group also capable of abstracting halide groups from $MY_n$. Examples of such halide-abstracting groups are dimethylsilyl and trimethylsilyl groups. Examples of useful ether compounds include $(CH_3)_3Si-O-Si(CH_3)_3$ (1,1,1,3,3,3-hexamethyldisiloxane), $(CH_3)_2(H)Si-O-Si(H)(CH_3)_2$ (1,1,3,3-tetramethyldisiloxane), $(CH_3)_3C-O-C(CH_3)_3$ (di-tert-butyl ether) and $C_6H_5CH_2-O-CH_2C_6H_5$ (dibenzyl ether).

Various precursor compounds can be used in various combinations, optionally with one or more organic solvents (particularly for CVD processes), to form a precursor composition. The precursor compounds may be liquids or solids at room temperature (preferably, they are liquids at the vaporization temperature). Typically, they are liquids sufficiently volatile to be employed using known vapor deposition techniques. However, as solids they may also be sufficiently volatile that they can be vaporized or sublimed from the solid state using known vapor deposition techniques. If they are less volatile solids, they are preferably sufficiently soluble in an organic solvent or have melting points below their decomposition temperatures such that they can be used in flash vaporization, bubbling, microdroplet formation techniques, etc. Herein, vaporized precursor compounds may be used either alone or optionally with vaporized molecules of other precursor compounds or optionally with vaporized solvent molecules, if used. As used herein, "liquid" refers to a solution or a neat liquid (a liquid at room temperature or a solid at room temperature that melts at an elevated temperature). As used herein, "solution" does not require complete solubility of the solid but may allow for some undissolved solid, as long as there is a sufficient amount of the solid delivered by the organic solvent into the vapor phase for chemical vapor deposition processing. If solvent dilution is used in deposition, the total molar concentration of solvent vapor generated may also be considered as a inert carrier gas.

The solvents that are suitable for this application (particularly for a CVD process) can be one or more of the following: aliphatic hydrocarbons or unsaturated hydrocarbons (C3–C20, and preferably C5–C10, cyclic, branched, or linear), aromatic hydrocarbons (C5–C20, and preferably C5–C10), halogenated hydrocarbons, silylated hydrocarbons such as alkylsilanes, alkylsilicates, ethers, polyethers, thioethers, esters, lactones, ammonia, amides, amines (aliphatic or aromatic, primary, secondary, or tertiary), polyamines, nitrites, cyanates, isocyanates, thiocyanates, silicone oils, alcohols, or compounds containing combinations of any of the above or mixtures of one or more of the above. The compounds are also generally compatible with each other, so that mixtures of variable quantities of the precursor compounds will not interact to significantly change their physical properties.

The precursor compounds can be vaporized in the presence of an inert carrier gas if desired. Additionally, an inert carrier gas can be used in purging steps in an ALD process. The inert carrier gas is typically selected from the group consisting of nitrogen, helium, argon, and mixtures thereof. In the context of the present invention, an inert carrier gas is one that is generally unreactive with the complexes described herein and does not interfere with the formation of the desired metal-containing film (i.e., layer).

The deposition process for this invention is a vapor deposition process. Vapor deposition processes are generally favored in the semiconductor industry due to the process capability to quickly provide highly conformal layers even within deep contacts and other openings. Chemical vapor deposition (CVD) and atomic layer deposition (ALD) are two vapor deposition processes often employed to form thin, continuous, uniform, metal-containing (preferably dielectric) layers onto semiconductor substrates. Using either vapor deposition process, typically one or more precursor compounds are vaporized in a deposition chamber and optionally combined with one or more reaction gases to form a metal-containing layer onto a substrate. It will be readily apparent to one skilled in the art that the vapor deposition process may be enhanced by employing various related techniques such as plasma assistance, photo assistance, laser assistance, as well as other techniques.

The final layer (preferably, a dielectric layer) formed preferably has a thickness in the range of about 10 Å to about 500 Å. More preferably, the thickness of the metal-containing layer is in the range of about 30 Å to about 80 Å.

In most vapor deposition processes, the precursor compound(s) are typically reacted with an oxidizing or reducing reaction gas at elevated temperatures to form the refractory metal-containing layer. However, in the practice of this invention, no such reaction gas is needed as the ether provides the source of oxygen needed in the vapor deposition process when reacting with the refractory metal precursor compound(s) to form the refractory metal-containing layer.

Chemical vapor deposition (CVD) has been extensively used for the preparation of metal-containing layers, such as dielectric layers, in semiconductor processing because of its ability to provide highly conformal and high quality dielectric layers at relatively fast processing times. The desired precursor compounds are vaporized and then introduced into a deposition chamber containing a heated substrate with optional reaction gases and/or inert carrier gases. In a typical CVD process, vaporized precursors are contacted with reaction gas(es) at the substrate surface to form a layer (e.g., dielectric layer). The single deposition cycle is allowed to continue until the desired thickness of the layer is achieved.

Typical CVD processes generally employ precursor compounds in vaporization chambers that are separated from the process chamber wherein the deposition surface or wafer is located. For example, liquid precursor compounds are typically placed in bubblers and heated to a temperature at which they vaporize, and the vaporized liquid precursor compound is then transported by an inert carrier gas passing over the bubbler or through the liquid precursor compound. The vapors are then swept through a gas line to the deposition chamber for depositing a layer on substrate surface(s) therein. Many techniques have been developed to precisely control this process. For example, the amount of precursor material transported to the deposition chamber can be precisely controlled by the temperature of the reservoir containing the precursor compounds and by the flow of an inert carrier gas bubbled through or passed over the reservoir.

Preferred embodiments of the precursor compounds described herein are particularly suitable for chemical vapor deposition (CVD). The deposition temperature at the substrate surface is preferably held at a temperature in a range of about 100° C. to about 600° C., more preferably in the range of about 200° C. to about 500° C. The deposition chamber pressure is preferably maintained at a deposition pressure of about 0.1 torr to about 10 torr. The partial pressure of precursor compounds in the inert carrier gas is preferably about 0.001 torr to about 10 torr.

Several modifications of the CVD process and chambers are possible, for example, using atmospheric pressure chemical vapor deposition, low pressure chemical vapor deposition (LPCVD), plasma enhanced chemical vapor deposition (PECVD), hot wall or cold wall reactors or any other chemical vapor deposition technique. Furthermore, pulsed CVD can be used, which is similar to ALD (discussed in greater detail below) but does not rigorously avoid intermixing of percursor and reactant gas streams. Also, for pulsed CVD, the deposition thickness is dependent on the exposure time, as opposed to ALD, which is self-limiting (discussed in greater detail below).

A typical CVD process may be carried out in a chemical vapor deposition reactor, such as a deposition chamber available under the trade designation of 7000 from Genus, Inc. (Sunnyvale, Calif.), a deposition chamber available under the trade designation of 5000 from Applied Materials, Inc. (Santa Clara, Calif.), or a deposition chamber available under the trade designation of Prism from Novelus, Inc. (San Jose, Calif.). However, any deposition chamber suitable for performing CVD may be used.

Alternatively, and preferably, the vapor deposition process employed in the methods of the present invention is a multi-cycle ALD process. Such a process is advantageous (particularly over a CVD process) in that in provides for optimum control of atomic-level thickness and uniformity to the deposited layer (e.g., dielectric layer) and to expose the metal precursor compounds to lower volatilization and reaction temperatures to minimize degradation. Typically, in an ALD process, each reactant is pulsed sequentially onto a suitable substrate, typically at deposition temperatures of about 25° C. to about 400° C. (preferably about 150° C. to about 300° C.), which is generally lower than presently used in CVD processes. Under such conditions the film growth is typically self-limiting (i.e., when the reactive sites on a surface are used up in an ALD process, the deposition generally stops), insuring not only excellent conformality but also good large area uniformity plus simple and accurate thickness control. Due to alternate dosing of the precursor compounds and/or reaction gases, detrimental vapor-phase reactions are inherently eliminated, in contrast to the CVD process that is carried out by continuous coreaction of the precursors and/or reaction gases. (See Vehkamäki et al, "Growth of $SrTiO_3$ and $BaTiO_3$ Thin Films by Atomic Layer Deposition," Electrochemical and Solid-State Letters, 2(10): 504–506 (1999)).

A typical ALD process includes exposing an initial substrate to a first chemical species (e.g., refractory metal precursor compound of the formula $MY_n$) to accomplish chemisorption of the species onto the substrate. Theoretically, the chemisorption forms a monolayer that is uniformly one atom or molecule thick on the entire exposed initial substrate. In other words, a saturated monolayer. Practically, chemisorption might not occur on all portions of the substrate. Nevertheless, such an imperfect monolayer is still a monolayer in the context of the present invention. In many applications, merely a substantially saturated monolayer may be suitable. A substantially saturated monolayer is one that will still yield a deposited layer exhibiting the quality and/or properties desired for such layer.

The first species is purged from over the substrate and a second chemical species (e.g., a different compound of the formula $MY_n$, a metal-containing precursor compound or a formula different than $MY_n$, or an ether compound) is provided to react with the first monolayer of the first species. The second species is then purged and the steps are repeated with exposure of the second species monolayer to the first species. In some cases, the two monolayers may be of the same species. As an option, the second species can react with the first species, but not chemisorb additional material thereto. That is, the second species can cleave some portion of the chemisorbed first species, altering such monolayer without forming another monolayer thereon. Also, a third species or more may be successively chemisorbed (or reacted) and purged just as described for the first and second species.

Purging may involve a variety of techniques including, but not limited to, contacting the substrate and/or monolayer with a carrier gas and/or lowering pressure to below the deposition pressure to reduce the concentration of a species contacting the substrate and/or chemisorbed species. Examples of carrier gases include $N_2$, Ar, He, etc. Purging may instead include contacting the substrate and/or monolayer with any substance that allows chemisorption by-products to desorb and reduces the concentration of a contacting species preparatory to introducing another species. The contacting species may be reduced to some suitable concentration or partial pressure known to those skilled in the art based on the specifications for the product of a particular deposition process.

ALD is often described as a self-limiting process, in that a finite number of sites exist on a substrate to which the first species may form chemical bonds. The second species might only bond to the first species and thus may also be self-limiting. Once all of the finite number of sites on a substrate are bonded with a first species, the first species will often not bond to other of the first species already bonded with the substrate. However, process conditions can be varied in ALD to promote such bonding and render ALD not self-limiting. Accordingly, ALD may also encompass a species forming other than one monolayer at a time by stacking of a species, forming a layer more than one atom or molecule thick.

The described method indicates the "substantial absence" of the second precursor (i.e., second species) during chemisorption of the first precursor since insignificant amounts of the second precursor might be present. According to the knowledge and the preferences of those with ordinary skill in the art, a determination can be made as to the tolerable amount of second precursor and process conditions selected to achieve the substantial absence of the second precursor.

Thus, during the ALD process, numerous consecutive deposition cycles are conducted in the deposition chamber, each cycle depositing a very thin metal-containing layer (usually less than one monolayer such that the growth rate on average is from about 0.2 to about 3.0 Angstroms per cycle), until a layer of the desired thickness is built up on the substrate of interest. The layer deposition is accomplished by alternately introducing (i.e., by pulsing) refractory metal precursor compound(s) and ether compound(s) into the deposition chamber containing a semiconductor substrate, chemisorbing the precursor compound(s) as a monolayer onto the substrate surfaces, and then reacting the chemisorbed precursor compound(s) with the other co-reactive precursor compound(s). The pulse duration of precursor compound(s) and inert carrier gas(es) is sufficient to saturate the substrate surface. Typically, the pulse duration is from about 0.1 to about 5 seconds, preferably from about 0.2 to about 1 second.

In comparison to the predominantly thermally driven CVD, ALD is predominantly chemically driven. Accordingly, ALD is often conducted at much lower temperatures than CVD. During the ALD process, the substrate temperature is maintained at a temperature sufficiently low to maintain intact bonds between the chemisorbed precursor compound(s) and the underlying substrate surface and to prevent decomposition of the precursor compound(s). The temperature is also sufficiently high to avoid condensation of the precursor compounds(s). Typically the substrate temperature is kept within the range of about 25° C. to about 400° C. (preferably about 150° C. to about 300° C.), which is generally lower than presently used in CVD processes. Thus, the first species or precursor compound is chemisorbed at this temperature. Surface reaction of the second species or precursor compound can occur at substantially the same temperature as chemisorption of the first precursor or, less preferably, at a substantially different temperature. Clearly, some small variation in temperature, as judged by those of ordinary skill, can occur but still be a substantially same temperature by providing a reaction rate statistically the same as would occur at the temperature of the first precursor chemisorption. Chemisorption and subsequent reactions could instead occur at exactly the same temperature.

For a typical ALD process, the pressure inside the deposition chamber is kept at about $10^{-4}$ torr to about 1 torr, preferably about $10^{-4}$ torr to about 0.1 torr. Typically, the deposition chamber is purged with an inert carrier gas after the vaporized precursor compound(s) have been introduced into the chamber and/or reacted for each cycle. The inert carrier gas(es) can also be introduced with the vaporized precursor compound(s) during each cycle.

The reactivity of a precursor compound can significantly influence the process parameters in ALD. Under typical CVD process conditions, a highly reactive compound may react in the gas phase generating particulates, depositing prematurely on undesired surfaces, producing poor films, and/or yielding poor step coverage or otherwise yielding non-uniform deposition. For at least such reason, a highly reactive compound might be considered not suitable for CVD. However, some compounds not suitable for CVD are superior ALD precursors. For example, if the first precursor is gas phase reactive with the second precursor, such a combination of compounds might not be suitable for CVD, although they could be used in ALD. In the CVD context, concern might also exist regarding sticking coefficients and surface mobility, as known to those skilled in the art, when using highly gas-phase reactive precursors, however, little or no such concern would exist in the ALD context.

After layer formation on the substrate, an annealing process can be optionally performed in situ in the deposition chamber in a nitrogen atmosphere or oxidizing atmosphere. Preferably, the annealing temperature is within the range of about 400° C. to about 1000° C. Particularly after ALD, the annealing temperature is more preferably about 400° C. to about 750° C., and most preferably about 600° C. to about 700° C. The annealing operation is preferably performed for a time period of about 0.5 minute to about 60 minutes and more preferably for a time period of about 1 minute to about 10 minutes. One skilled in the art will recognize that such temperatures and time periods may vary. For example, furnace anneals and rapid thermal annealing may be used, and further, such anneals may be performed in one or more annealing steps.

As stated above, the use of the complexes and methods of forming films of the present invention are beneficial for a wide variety of thin film applications in semiconductor structures, particularly those using high dielectric materials or ferroelectric materials. For example, such applications include capacitors such as planar cells, trench cells (e.g., double sidewall trench capacitors), stacked cells (e.g., crown, V-cell, delta cell, multi-fingered, or cylindrical container stacked capacitors), as well as field effect transistor devices.

A specific example of where a dielectric layer is formed according to the present invention is a capacitor construction. Exemplary capacitor constructions are described with reference to FIGS. 1–3. Referring to FIG. 1, a semiconductor wafer fragment 10 includes a capacitor construction 25 formed by a method of the present invention. Wafer fragment 10 includes a substrate 12 having a conductive diffusion area 14 formed therein. Substrate 12 can include, for example, monocrystalline silicon. An insulating layer 16, typically borophosphosilicate glass (BPSG), is provided over substrate 12, with a contact opening 18 provided therein to diffusion area 14. A conductive material 20 fills contact opening 18, with material 20 and oxide layer 18 having been planarized as shown. Material 20 might be any suitable conductive material, such as, for example, tungsten or conductively doped polysilicon. Capacitor construction 25 is provided atop layer 16 and plug 20, and electrically connected to node 14 through plug 20.

Capacitor construction 25 includes a first capacitor electrode 26, which has been provided and patterned over node 20. Examplary materials include conductively doped polysilicon, Pt, Ir, Rh, Ru, $RuO_2$, $IrO_2$, $RhO_2$. A capacitor dielectric layer 28 is provided over first capacitor electrode 26. The materials of the present invention can be used to form the capacitor dielectric layer 28. Preferably, if first capacitor electrode 26 includes polysilicon, a surface of the polysilicon is cleaned by an in situ HF dip prior to deposition of the dielectric material. An exemplary thickness for layer 28 in accordance with 256 Mb integration is 100 Angstroms.

A diffusion barrier layer 30 is provided over dielectric layer 28. Diffusion barrier layer 30 includes conductive materials such as TiN, TaN, metal silicide, or metal silicide-nitride, and can be provided by CVD, for example, using conditions well known to those of skill in the art. After formation of barrier layer 30, a second capacitor electrode 32 is formed over barrier layer 30 to complete construction of capacitor 25. Second capacitor electrode 32 can include constructions similar to those discussed above regarding the first capacitor electrode 26, and can accordingly include, for example, conductively doped polysilicon. Diffusion barrier layer 30 preferably prevents components (e.g., oxygen) from diffusing from dielectric material 28 into electrode 32. If, for example, oxygen diffuses into a silicon-containing electrode 32, it can undesirably form $SiO_2$, which will significantly reduce the capacitance of capacitor 25. Diffusion barrier layer 30 can also prevent diffusion of silicon from metal electrode 32 to dielectric layer 28.

Figure 2:
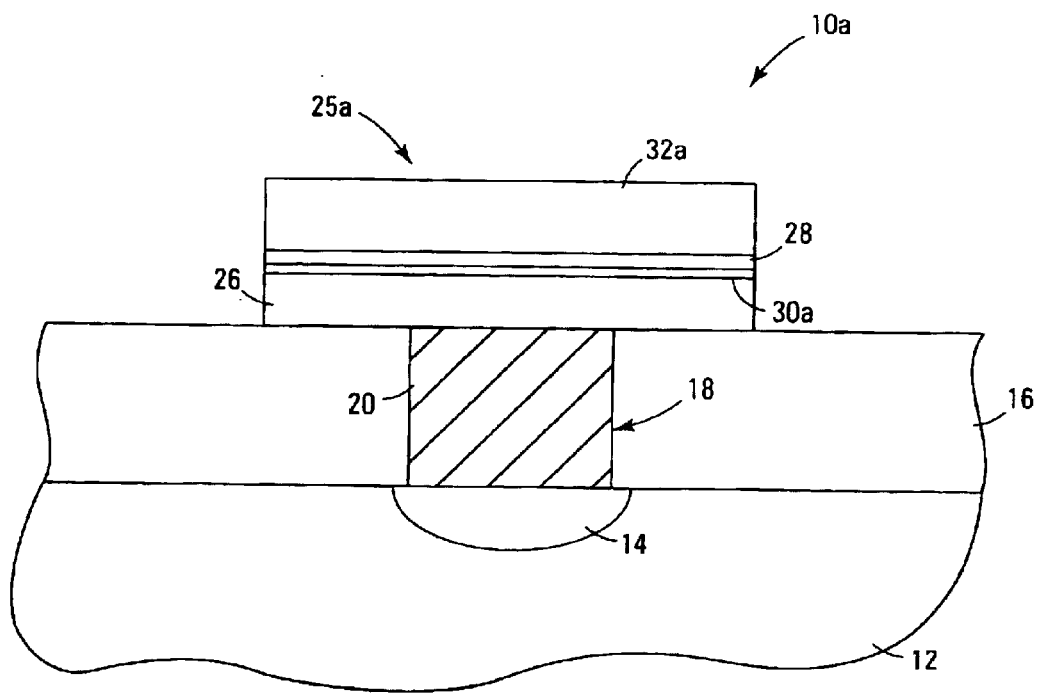

FIG. 2 illustrates an alternative embodiment of a capacitor construction. Like numerals from FIG. 1 have been utilized where appropriate, with differences indicated by the suffix "a". Wafer fragment 10a includes a capacitor construction 25a differing from the construction 25 of FIG. 2 in provision of a barrier layer 30a between first electrode 26 and dielectric layer 28, rather than between dielectric layer 28 and second capacitor electrode 32. Barrier layer 30a can include constructions identical to those discussed above with reference to FIG. 1.

Figure 3:
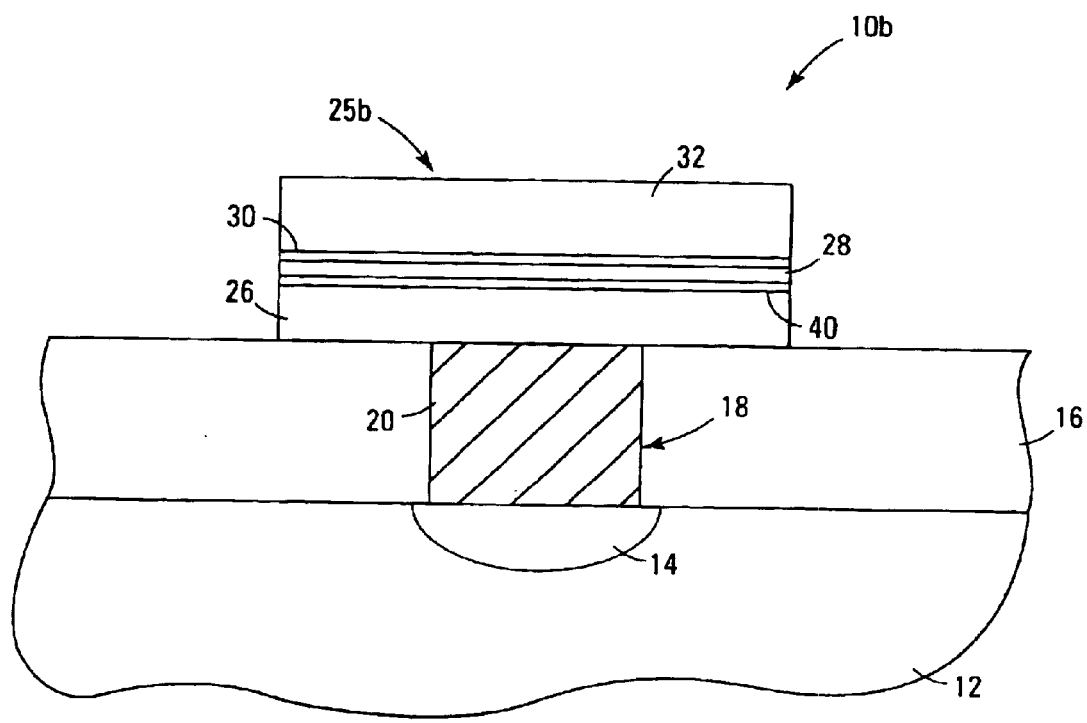

FIG. 3 illustrates yet another alternative embodiment of a capacitor construction. Like numerals from FIG. 1 are utilized where appropriate, with differences being indicated by the suffix "b" or by different numerals. Wafer fragment 10b includes a capacitor construction 25b having the first and second capacitor plate 26 and 32, respectively, of the first described embodiment. However, wafer fragment 10b differs from wafer fragment 10 of FIG. 2 in that wafer fragment 10b includes a second barrier layer 40 in addition to the barrier layer 30. Barrier layer 40 is provided between first capacitor electrode 26 and dielectric layer 28, whereas barrier layer 30 is between second capacitor electrode 32 and dielectric layer 28. Barrier layer 40 can be formed by methods identical to those discussed above with reference to FIG. 1 for formation of the barrier layer 30.

In the embodiments of FIGS. 1–3, the barrier layers are shown and described as being distinct layers separate from the capacitor electrodes. It is to be understood, however, that the barrier layers can include conductive materials and can accordingly, in such embodiments, be understood to include at least a portion of the capacitorr electrodes. In particular embodiments an entirety of a capacitor electrode can include conductive barrier layer materials.

Figure 4:
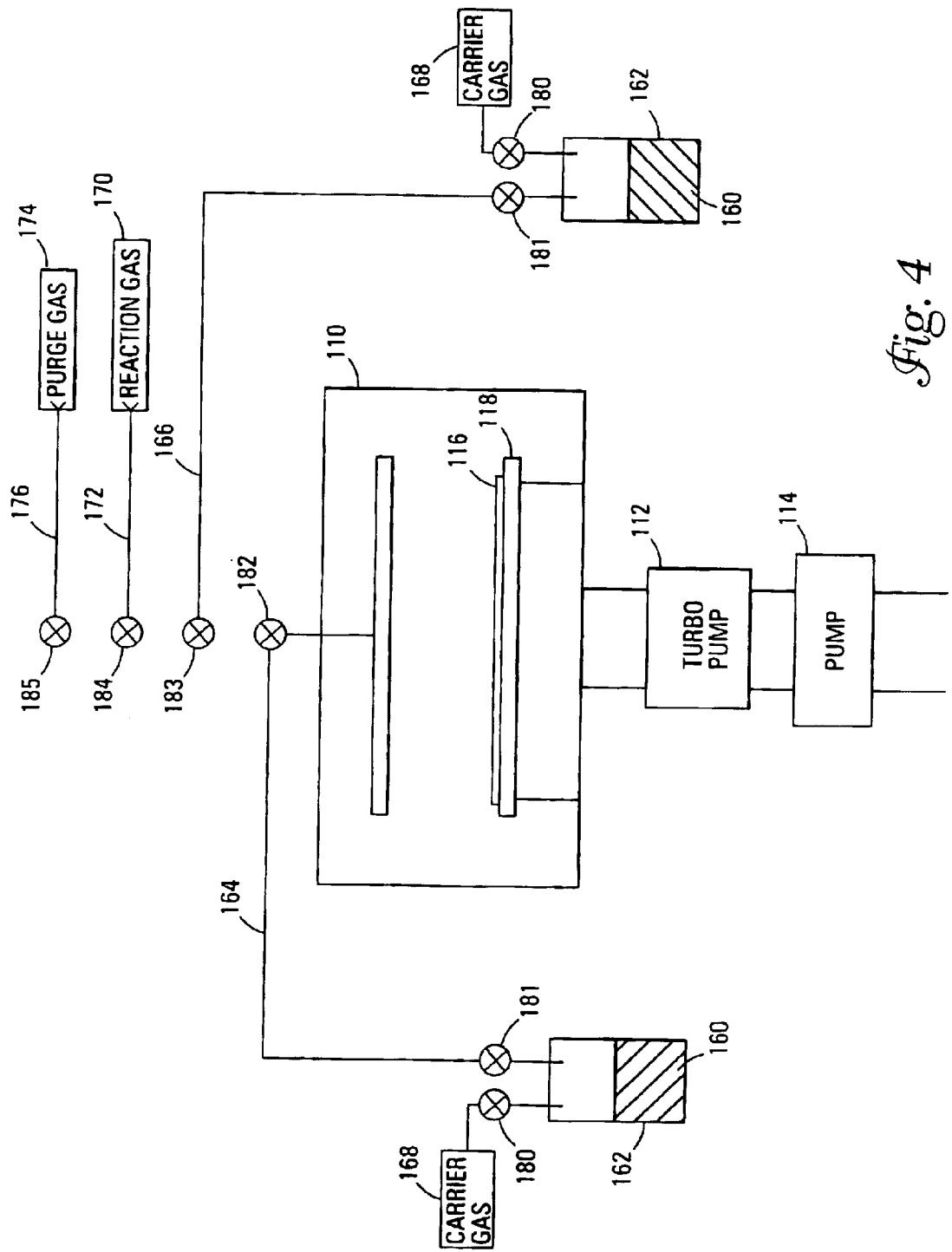
FIG. 4 is a perspective view of a vapor deposition coating system suitable for use in the method of the present invention.

A system that can be used to perform vapor deposition processes (chemical vapor deposition or atomic layer deposition) of the present invention is shown in FIG. 4. The system includes an enclosed vapor deposition chamber 110, in which a vacuum may be created using turbo pump 112 and backing pump 114. One or more substrates 116 (e.g., semiconductor substrates or substrate assemblies) are positioned in chamber 110. A constant nominal temperature is established for substrate 116, which can vary depending on the process used. Substrate 116 may be heated, for example, by an electrical resistance heater 118 on which substrate 116 is mounted. Other known methods of heating the substrate may also be utilized.

In this process, precursor compounds 160 (e.g., a refractory metal precursor compound and an ether) are stored in vessels 162. The precursor compounds are vaporized and separately fed along lines 164 and 166 to the deposition chamber 110 using, for example, an inert carrier gas 168. A reaction gas 170 may be supplied along line 172 as needed. Also, a purge gas 174, which is often the same as the inert carrier gas 168, may be supplied along line 176 as needed. As shown, a series of valves 180–185 are opened and closed as required.

The following examples are offered to further illustrate the various specific and preferred embodiments and techniques. It should be understood, however, that many variations and modifications may be made while remaining within the scope of the present invention, so the scope of the invention is not intended to be limited by the examples.

EXAMPLES

Example 1

Atomic Layer Deposition of Tantalum Pentoxide

Using an ALD process, precursor compounds tantalum pentafluoride, (TaF5), and 1,1,3,3-tetramethyldisiloxane, $(CH_3)_2(H)Si-O-Si(H)(CH_3)_2$, (both available from Sigma-Aldrich Chemical Co., Milwaukee, Wis.) were alternatively pulsed into a deposition chamber containing a platinum electrode having a surface temperature of about 260° C. After 800 cycles, a $Ta_2O_5$ layer having a thickness of 400 Å was achieved, the layer having no silicon or carbon contamination and a only trace of fluorine contamination (no more than 2 atom %) as determined by atomic emission spectroscopy (AES) analysis. X-ray diffraction analysis (XDA) showed the layer to be mainly amorphous with some (001) oriented hexagonal phase present, which remained the preferred crystalline orientation after the layer was annealed at 750° C. in an oxygen atmosphere.

A capacitor was formed by using physical vapor deposition to sputter platinum top electrodes through a hard mask on the as-deposited $Ta_2O_5$ layer. Dielectric constants of near 60 were obtained on 0.4 $mm^2$ capacitors, measured at frequencies between 0.1 kHz and 100 kHz. Leakage was $6 \times 10^{-7}$ $A/cm^2$. Excellent step coverage was obtained on structured wafers with containers having a 10:1 aspect ratio.

The complete disclosures of the patents, patent documents, and publications cited herein are incorporated by reference in their entirety as if each were individually incorporated. Various modifications and alterations to this invention will become apparent to those skilled in the art without departing from the scope and spirit of this invention. It should be understood that this invention is not intended to be unduly limited by the illustrative embodiments and examples set forth herein and that such examples and embodiments are presented by way of example only with the scope of the invention intended to be limited only by the claims set forth herein as follows.

What is claimed is:

1. A method of forming a layer on a substrate, the method comprising:

providing a substrate;

providing a vapor comprising one or more refractory metal precursor compounds of the formula $MY_n$ (Formula I), wherein M is a refractory metal, each Y is independently a halogen atom, and n is an integer selected to match the valence of the metal M;

providing a vapor comprising one or more ethers of the formula $R^1$—O—$R^2$, wherein $R^1$ and $R^2$ are each independently organic groups, and with the proviso that at least one of the one or more ethers comprises tetramethyldisiloxane; and directing the vapors comprising the one or more refractory metal precursor compounds and the one or more ethers to the substrate to form a refractory metal oxide layer on one or more surfaces of the substrate.

2. The method of claim 1 wherein Y is independently selected from the group consisting of F, Cl, I, and combinations thereof.

3. The method claim 2 wherein each Y is independently a fluorine atom.

4. The method of claim 3 wherein M is tantalum and n is 5.

5. The method of claim 1 wherein M is tantalum and n is 5.

6. The method of claim 1 wherein the substrate comprises a material selected from the group consisting of silicon, platinum, titanium nitride, tantalum nitride, tantalum-silicon-nitride.

7. The method of claim 1 wherein the formed layer has a thickness of about 10 Å to about 100 Å.

8. The method of claim 1 wherein the formed layer is a $Ta_2O_5$ layer.

9. The method of claim 8 wherein the $Ta_2O_5$ layer comprises a crystalline hexagonal phase.

10. The method of claim 1 wherein the formed layer is a dielectric layer.

11. The method of claim 1 wherein providing the vapors and directing the vapors is accomplished using a chemical vapor deposition process.

12. The method of claim 11 wherein the temperature of the substrate is about 100° C. to about 600° C.

13. The method of claim 1 wherein providing the vapors and directing the vapors is accomplished using an atomic layer deposition process comprising a plurality of deposition cycles.

14. The method of claim 13 wherein the temperature of the substrate is about 25° C. to about 400° C.

15. The method of claim 1 further comprising providing a vapor comprising one or more metal-containing precursor compounds having a formula different than Formula I and directing the vapor comprising the one or more compounds having a formula different than Formula I to the substrate.

16. A method of manufacturing a semiconductor structure, the method comprising:

providing a semiconductor substrate or substrate assembly;

providing a vapor comprising one or more refractory metal precursor compounds of the formula $MY_n$ (Formula I), wherein M is a refractory metal, each Y is independently a halogen atom, and n is an integer selected to match the valence of the metal M;

providing a vapor comprising one or more ethers of the formula $R^1$—O—$R^2$, wherein $R^1$ and $R^2$ are each independently organic groups, and with the proviso that at least one of the one or more ethers comprises tetramethyldisiloxane; and directing the vapors comprising the one or more refractory metal precursor compounds and the one or more ethers to the semiconductor substrate or substrate assembly to form a refractory metal oxide layer on one or more surfaces of the semiconductor substrate or substrate assembly.

17. The method of claim 16 wherein the semiconductor substrate or substrate assembly is a silicon wafer.

18. The method of claim 16 wherein Y is independently selected from the group consisting of F, Cl, I, and combinations thereof.

19. The method of claim 18 wherein each Y is independently a flourine atom.

20. The method of claim 16 wherein M is tantalum and n is 5.

21. The method of claim 16 wherein providing the vapors and directing the vapors is accomplished using an atomic layer deposition process comprising a plurality of deposition cycles.

22. The method of claim 21 wherein the temperature of the semiconductor substrate or substrate assembly is about 25° C. to about 400° C.

23. The method of claim 21 wherein the semiconductor substrate or substrate assembly is in a deposition chamber having a pressure of about $10^{-4}$ torr to about 1 torr.

24. The method of claim 21 wherein during the atomic layer deposition process, the refractory metal oxide layer is formed by alternately introducing the one or more vaporized precursor compounds and one or more vaporized ethers during each deposition cycle.

25. The method of claim 16 wherein the substrate comprises a material selected from the group consisting of silicon, platinum, titanium nitride, tantalum nitride, tantalum-silicon-nitride.

26. The method of claim 16 wherein the formed layer has a thickness of about 10 Å to about 100 Å.

27. The method of claim 16 wherein the formed layer is a $Ta_2O_5$ layer.

28. The method of claim 27 wherein the $Ta_2O_5$ layer comprises a crystalline hexagonal phase.

29. The method of claim 16 wherein the formed layer is a dielectric layer.

30. The method of claim 16 wherein providing the vapors and directing the vapors is accomplished using a chemical vapor deposition process.

31. The method of claim 30 wherein the temperature of the semiconductor substrate or substrate assembly is about 100° C. to about 600° C.

32. The method of claim 30 wherein the semiconductor substrate or substrate assembly is in a deposition chamber having a pressure of about 0.1 torr to about 10 torr.

33. The method of claim 16 further comprising providing a vapor comprising one or more metal-containing precursor compounds having a formula different than Formula I and directing the vapor comprising the one or more compounds having a formula different than Formula I to the semiconductor substrate or substrate assembly.

34. A method of manufacturing a memory device, the method comprising:

providing a substrate having a first electrode thereon;

providing a vapor comprising one or more refractory metal precursor compounds of the formula $MY_n$ (Formula I) wherein M is a refractory metal, each Y is independently a halogen atom, and n is an integer selected to match the valence of the metal M;

providing a vapor comprising one or more ethers of the formula R¹—O—R², wherein R¹ and R² are each independently organic groups, and with the proviso that at least one of the one or more ethers comprises tetramethyldisiloxane;

directing the vapors comprising the one or more refractory metal precursor compounds and the one or more ethers to the substrate to form a refractory metal oxide dielectric layer on the first electrode of the substrate; and forming a second electrode on the dielectric layer.

35. The method of claim 34 wherein the substrate is a semiconductor substrate or substrate assembly.

36. The method of claim 34 wherein formed layer has a thickness of about 10 Å to about 100 Å.

37. The method of claim 34 wherein the formed layer is a $Ta_2O_5$ layer.

38. The method of claim 34 wherein the $Ta_2O_5$ layer comprises a crystalline hexagonal phase.

39. The method of claim 34 further comprising providing an inert carrier gas for directing the one or more vaporized refractory metal precursor compounds and the one or more vaporized ethers to the substrate.

40. The method of claim 39 wherein the inert carrier gas is selected from the group consisting of nitrogen, helium, and argon.

41. The method of claim 34 wherein providing the vapors and directing the vapors is accomplished using an atomic layer deposition process comprising a plurality of deposition cycles.

42. The method of claim 34 wherein providing the vapors and directing the vapors is accomplished using a chemical vapor deposition process.

43. The method of claim 34 further comprising providing a vapor comprising one or more metal-containing precursor compounds having a formula different than Formula I and directing the vapor comprising the one or more compounds having a formula different than Formula I to the substrate.

* * * * *